US006392507B1

(12) United States Patent
Kim

(10) Patent No.: US 6,392,507 B1

(45) Date of Patent: May 21, 2002

(54) SIGNAL-PROCESSING APPARATUS FOR SHIFTING PHASE OF A SIGNAL INPUTTED THERETO AND ATTENUATING THE SIGNAL

(75) Inventor: Duk-Yong Kim, Seoul (KR)

(73) Assignee: KMW Co., Ltd., Kyungki-do (KR)

( * ) Notice: Subject to any disclaimer, the term of this patent is extended or adjusted under 35 U.S.C. 154(b) by 0 days.

(21) Appl. No.: 09/572,972

(22) Filed: May 18, 2000

(30) Foreign Application Priority Data

May 19, 1999 (KR) ........................................ 99-17968
Aug. 16, 1999 (KR) ........................................ 99-33577

(51) Int. Cl.[7] .............................. H01P 1/18; H03H 7/20

(52) U.S. Cl. ....................... 333/156; 333/139; 333/159; 333/160

(58) Field of Search ................................ 333/139, 156, 333/159, 160

(56) References Cited

U.S. PATENT DOCUMENTS 4,721,959 A * 1/1988 Syrigos
4,788,515 A * 11/1988 Wong et al.
4,824,399 A * 4/1989 Bogar et al.
5,376,905 A * 12/1994 Kich
5,877,660 A * 3/1999 Ebine et al.

* cited by examiner

*Primary Examiner*—Robert Pascal
*Assistant Examiner*—Patricia T. Nguyen
(74) *Attorney, Agent, or Firm*—Greenblum & Bernstein, P.L.C.

(57) ABSTRACT

A signal-processing apparatus is capable of stably operating without regard to outside circumstances and miniaturizing. The signal-processing apparatus for shifting phase of a signal inputted thereto and attenuating the signal includes an input connector for inputting a signal; an output connector for outputting the signal; a rotation body to be rotated by the rotational force provided from the rotational force supplying means; a plurality of rotatable members respectively having a groove in peripheral portion, the rotatable members being coupled to peripheral portion of the rotation body so that the grooves communicate with each other; and a signal transmitting member for transmitting the inputted signal to the output connector, the signal transmitting member being located in the grooves and its both ends being respectively connected to the input and output connectors.

21 Claims, 15 Drawing Sheets

SIGNAL-PROCESSING APPARATUS FOR SHIFTING PHASE OF A SIGNAL INPUTTED THERETO AND ATTENUATING THE SIGNAL

FIELD OF THE INVENTION

The present invention relates to a signal-processing apparatus for shifting phase of a signal inputted thereto and attenuating the signal and, more particularly, to a signal-processing apparatus capable of stably operating without regard to outside circumstances such as a temperature etc. and miniaturizing.

DESCRIPTION OF THE PRIOR ART

Generally, a communication system needs a signal-processing apparatus such as a phase shifter for shifting phase of a signal inputted thereto and an attenuator for attenuating the signal and so on.

Referring to FIGS. 1A and 1B, there are shown a conventional signal-processing apparatus for shifting phase of a signal inputted thereto and attenuating the signal.

As shown in FIG. 1A, the conventional signal-processing apparatus includes a hollow housing 3, input and output connectors 1 and 2 coupled to a side of the housing 3, a W-shaped conductor 4 having both ends respectively connected to the input and output connectors 1 and 2, a dielectric material 5 movably connected to the conductor 4 and a handle 6 rotatably coupled to the other side of the housing 3. The handle 6 is used for providing a moving force to the dielectric material 5.

When a signal is inputted to an end of the conductor 4 through the input connector 1, as illustrated by arrow in the FIG. 1A, the signal is outputted from the output connector 2 connected to the other end of the conductor 4 through the dielectric material 5. In this case, total length of the arrow represents that of a transmission line for passing the inputted signal.

The conventional signal-processing apparatus functions as a phase shifter. That is, when the handle 6 is rotated and the conductor 4 is moved left or right, total length of the transmission line is changed and, therefore, phase of the inputted signal is shifted and the transmission time of the signal is delayed.

Further, in the conventional signal-processing apparatus, when the dielectric material is replaced with an absorber 50 as shown in FIG. 1B, the conventional apparatus functions as an attenuator. That is, the absorber 50 attenuates a radio wave passing the conductor 4.

However, in the conventional signal-processing apparatus as above-mentioned, since the housing has a space capable of moving the dielectric material, there is a problem that it is difficult to miniaturize the signal-processing apparatus is difficult.

In order to overcome the problem, another conventional signal-processing apparatus has an electric device, such as a diode, functioning as a transmission line of a signal inputted to an input connector.

However, since the electric device is damaged when high electric power flows thereinto, it is difficult that the electric device is used for communication system.

Further, since the electric device sensitively acts to outside circumstances such as temperature, there is a problem that the communication system is unstable.

SUMMARY OF THE INVENTION

It is, therefore, an object of the present invention to provide a signal-processing apparatus capable of resolving the problems of the prior arts.

In accordance with an aspect of the present invention, there is provided a signal-processing apparatus for shifting phase of a signal inputted thereto and attenuating the signal, comprising: an input connector for inputting a signal; an output connector for outputting the signal; a rotational force supplying means for generating a rotational force; a rotation body to be rotated by the rotational force provided from the rotational force supplying means; a plurality of rotatable members respectively having a groove in peripheral portion, the rotatable members being coupled to peripheral portion of the rotation body so that the grooves communicate with each other; and a signal transmitting member for transmitting the inputted signal to the output connector, the signal transmitting member being located in the grooves and its both ends being respectively connected to the input and output connectors.

In accordance with another aspect of the present, there is provided a signal-processing apparatus for shifting phase of a signal inputted thereto and attenuating the signal, comprising; an input connector for inputting a signal; an output connector for outputting the signal; a rotation body to be rotated by the rotational force provided from the rotational force supplying means, the rotation body having an annular opening at lower portion thereof and being made of conductor; a plurality of rotatable members respectively having a groove in lower portion, the rotatable members being coupled to peripheral portion of the rotation body so that the grooves communicate with each other; and a signal transmitting member having terminals respectively connected to the input and output connectors so that the signal inputted to the input connector is transmitted to the output connector, the signal transmitting member being located in the groove.

In accordance with another aspect of the present, there is provided a signal-processing apparatus for shifting phase of a signal inputted thereto and attenuating the signal, comprising; an input connector for inputting a signal; an output connector for outputting the signal; a first rotation body to be rotated by a rotational force, the first rotation body having a first shaft connected to the rotational force supplying means and a first disk coupled to peripheral portion of the first shaft to be moved together with the first shaft; a first member coupled to peripheral portion of the first shaft to be moved together with the first shaft; a second member coupled to peripheral portion of the first shaft, against to the first member, to be moved together with the first shaft; and a signal transmitting member for transmitting the signal inputted through the input connector to the output connector, the signal transmitting member being located under the first and second members and its both ends being respectively connected to the input and output connectors.

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Hereinafter, various embodiments of a signal-processing apparatus in accordance with a present invention will be described in detail, referring to the accompanying FIGS. 2 to 15.

Figure 1A:
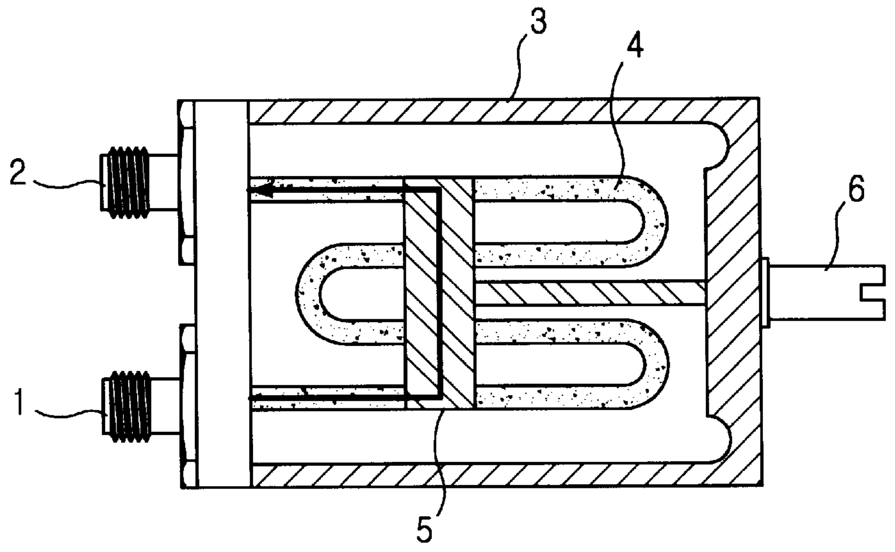
FIG. 1A (PRIOR ART)
FIGS. 1A and 1B are cross-sectional views showing structures of a conventional signal-processing apparatus.
Figure 1B:
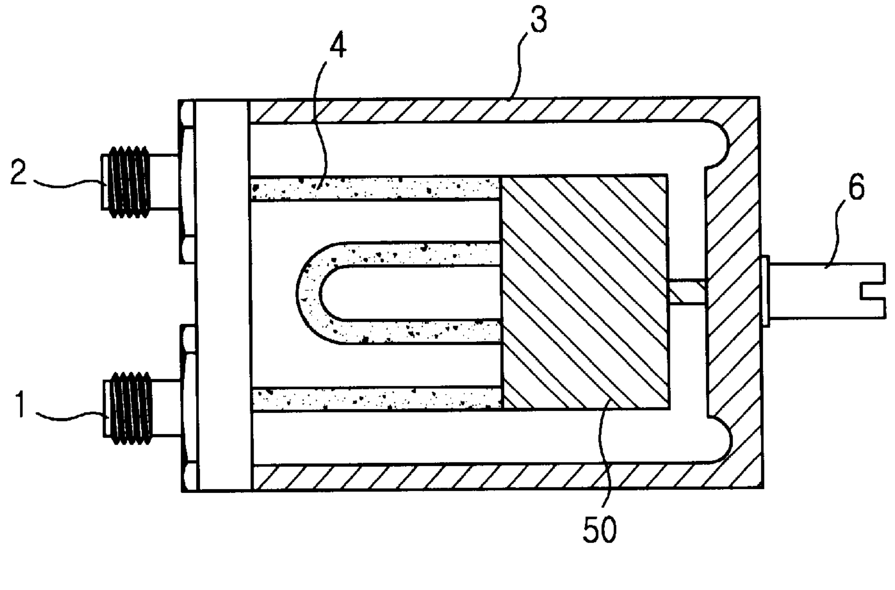
FIG. 1B (PRIOR ART)
Figure 2:
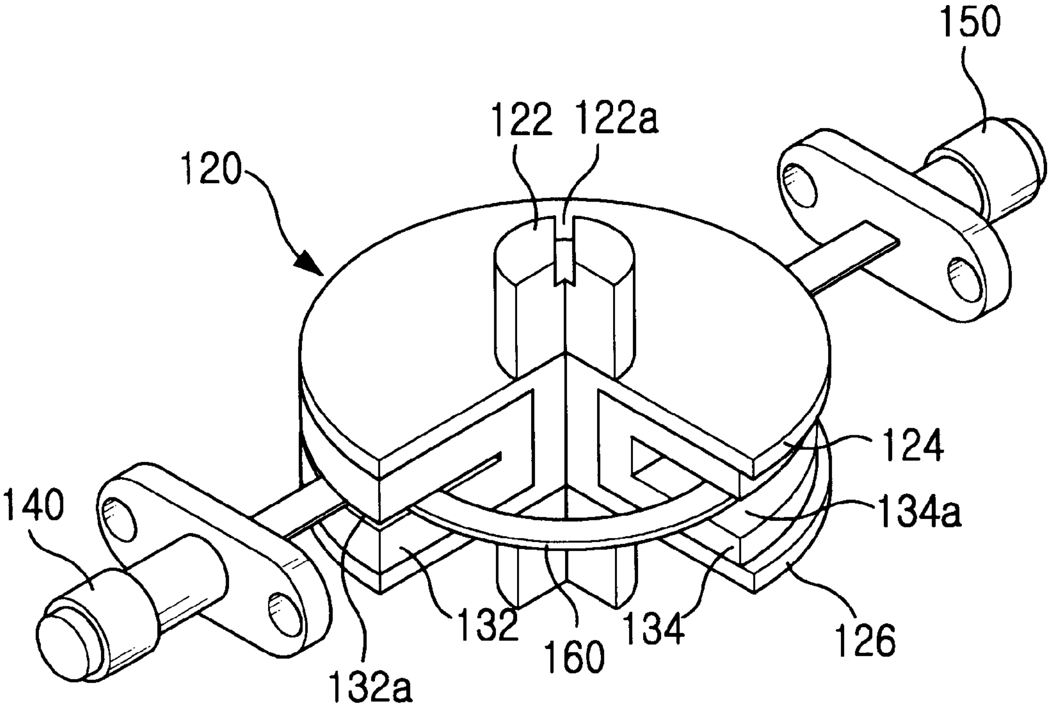
FIG. 2 is a perspective view schematically representing a first embodiment of a signal-processing apparatus for shifting phase of a signal inputted thereto and attenuating the signal in accordance with a present invention, with cutting off a portion.
Figure 3:
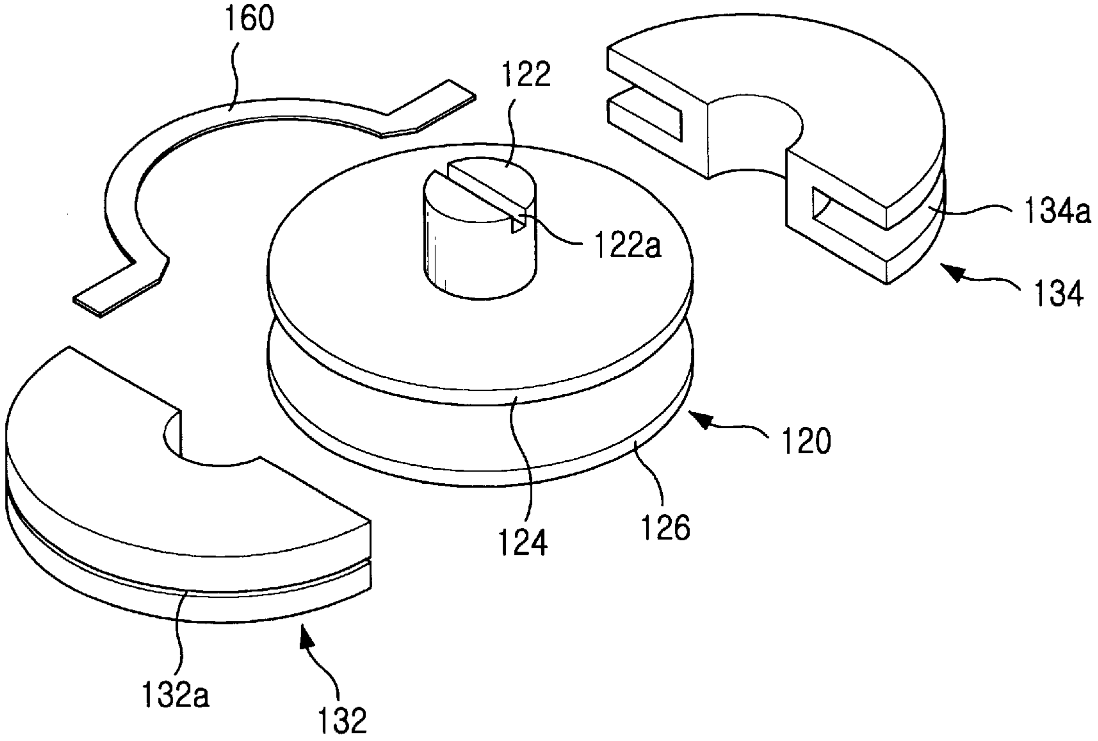
FIG. 3 is a disassembled perspective view depicting components of the FIG. 2 in detail.
Figure 4:
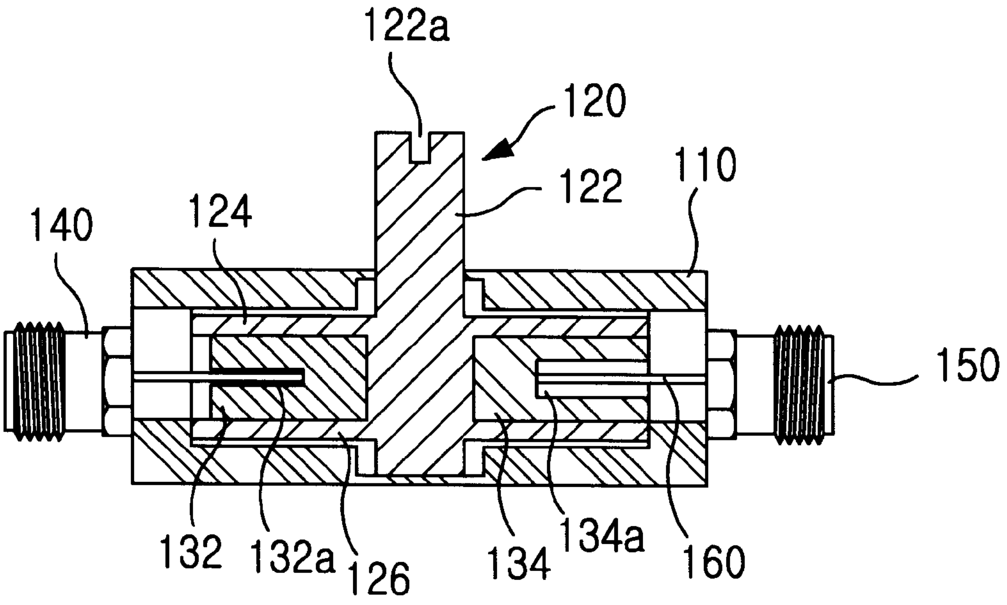
FIG. 4 is a cross-sectional view of the FIG. 2.

Referring to FIGS. 2 to 4, there is shown a signal-processing apparatus of a first embodiment in accordance with a present invention.

The signal-processing apparatus in accordance with first embodiment of the present invention comprises a housing 110 (see FIG. 4), an outer conductor 120 rotatably coupled within the housing 110, a first and second members 132 and 134 coupled within the outer conductor 120 to rotate together with the outer conductor 120, an input connector 140 coupled to a side of the housing 110, an output connector 150 coupled to a side of the housing 110 opposite to the input connector 140 and an inner conductor 160 located within the first and second members 132 and 134. Both ends of the inner conductor 160 are respectively connected to the input and output conductors 140 and 150 to retain its place.

The first and second members 132 and 134 respectively take the shape of semicircle and the inner conductor 160 takes the shape of substantial semicircular arch.

In this embodiment, the outer conductor 120 includes a shaft 122 passing the upper portion of the housing 110 and first and second disks 124 and 126 positioned at peripheral portion of the shaft 122. The first and second disks 124 and 126 are spaced out a predetermined distance on upper and lower portions of the shaft 122 so that the first and second members 132 and 134 are fitted therebetween. Preferably, upper portion of the shaft 122 has a recess 122*a* to connect a motor (not shown) for providing a rotational force. In this case, the shaft 122 is perpendicular to the first and second disks 124 and 126. The shaft 122, first and second disks 124 and 126 (i.e., the outer conductor 120) are integrally formed.

Further, the first and second members 132 and 134 respectively have first and second grooves 132*a* and 134*a* in which the inner conductor 160 is coupled. Height of the second groove 134*a* is higher than that of the first groove 132*a*. When the first and second members 132 and 134 are assembled to the outer conductor 120, the first and second grooves 132*a* and 134*a* are communicated with each other. The inner conductor 160 has a curvature substantially equal to the first and second grooves 132*a* and 134*a*.

In the first embodiment constructed as the above-mentioned, if the first and second members 132 and 134 are made of a first and second dielectric material respectively having dielectric constants different from each other, the signal-processing apparatus functions as a phase shifter. That is, when the shaft 122 is rotated, the first and second dielectric materials 132 and 134 are rotated together with the first and second disks 124 and 126 and the inner conductor 160 retains its original position. In this case, dielectric constant around the inner conductor 160 is continuously changed as the rotation of the shaft 122. Therefore, while a signal inputted to the input connector 140 is transmitted to the output connector 150 through the inner conductor 160, phase of the signal is shifted so that a transmission time of the signal is delayed. For example, when the dielectric constant of the first dielectric material 132 is greater than that of the second dielectric material 134 and the total inner conductor 160 is positioned within the first groove 132*a*, each of the phase shift and delay time has maximum value. On the contrary, when the total inner conductor 160 is positioned within the second groove 134*a* having lower dielectric constant, each of the phase shift and delay time has minimum value.

Further, when the inner conductor 160 is laid cross the first and second dielectric materials 132 and 134, each of the phase shift and delay time has value between the maximum value and the minimum value.

On the other hand, if the first and second members 132 and 134 are respectively made of a first and second absorbers capable of absorbing a radio wave, i.e., ferrite, the signal-processing apparatus of the first embodiment functions as an attenuator. That is, when a signal inputted to the input connector 140 is passed through the inner conductor 160, the signal is attenuated by the absorber and, then, be outputted from the output connector 150.

Figure 5A:
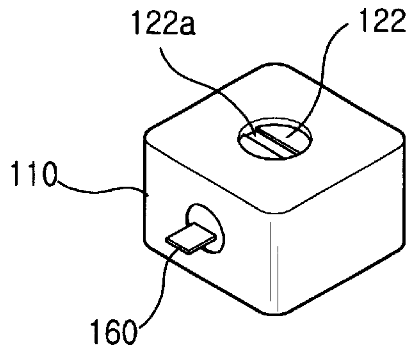
FIGS. 5A to 5C are perspective views illustrating various modifications of the FIG. 2 adapted to a printed circuit board.
Figure 5B:
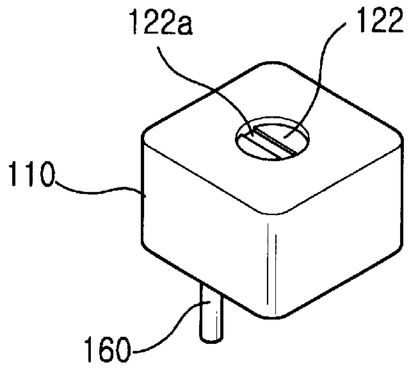
Figure 5C:
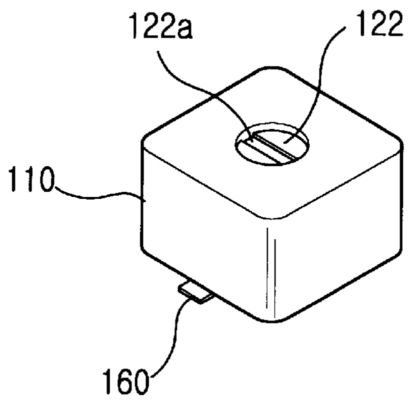

Referring to FIGS. 5A to 5C, there are perspective views illustrating various modifications of the first embodiment adapted to a printed circuit board.

Referring to FIG. 5A, the input and output connectors are removed and the both ends of the inner conductor 160 are directly connected to a printed circuit board (hereinafter, referred as PCB) respectively.

Referring to FIG. 5B, the both ends of the inner conductor 160 are folded one time to be fixed to the PCB.

Referring to FIG. 5C, the both ends of the inner conductor 160 are folded several times to be directly fixed to a mounter of the PCB.

Figure 6:
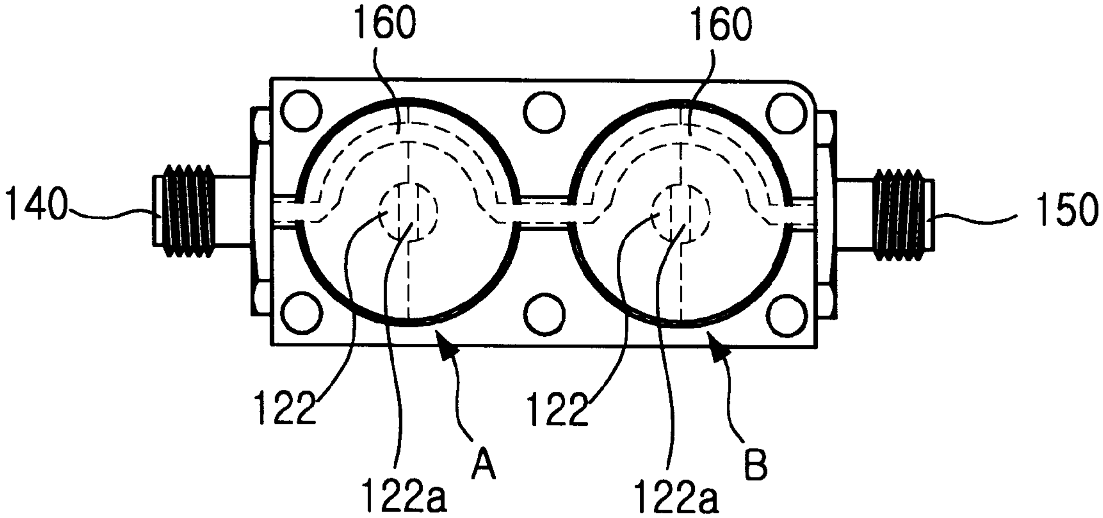
FIG. 6 is a plan view showing the other modification of the FIG. 2.

Referring to FIG. 6, there is shown a plan view showing another application of the first embodiment in accordance with the present invention.

Referring to FIG. 6, the signal-processing apparatus consists of a phase shifter "A" which the first and second members are made of dielectric material respectively having dielectric constants different from each other and an attenuator "B" which the first and second members are made of absorbers. In this case, an end of inner conductor 160 of the phase shifter "A" is connected to an end of inner conductor 160 of the attenuator "B". Further, the other end of inner conductor 160 of the phase shifter "A" is connected to the input connector 140 and the other end of inner conductor 160 of the attenuator "B" is connected to the out connector 150. Then, the signal-processing apparatus can simultaneously perform functions as the phase shifter and attenuator.

Figure 7:
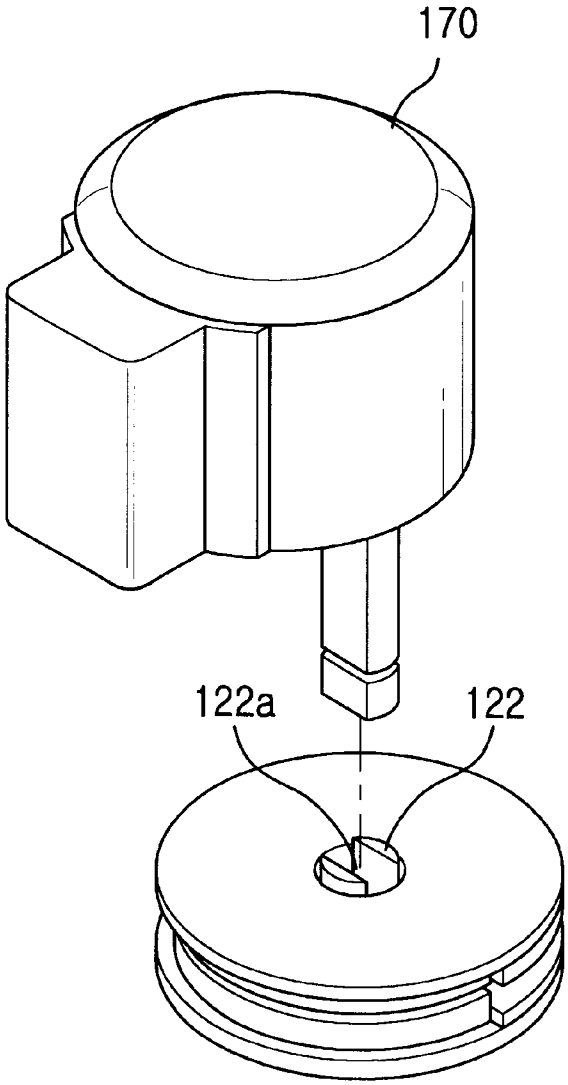
FIG. 7 illustrates a motor for rotating outer conductor of the signal-processing apparatus of the FIG. 2.

Referring to FIG. 7, the driving shaft of a motor 170 is fitted to the recess 122*a* of the shaft 122. In this case, rotation of the shaft 122 is controlled by controlling the operation of the motor 170. The motor 170 can be remote-controlled.

Figure 8:
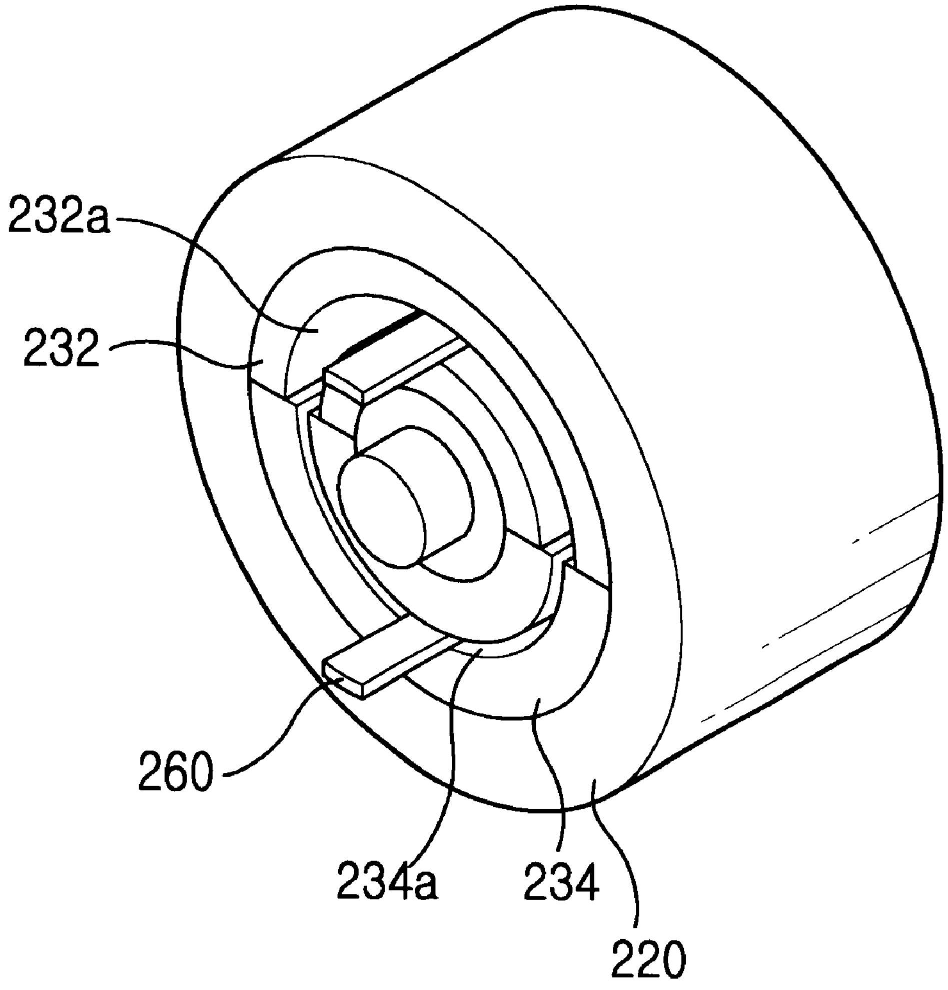
FIG. 8 is a perspective view schematically representing a second embodiment of a signal-processing apparatus for shifting phase of a signal inputted thereto and attenuating the signal in accordance with a present invention.
Figure 9:
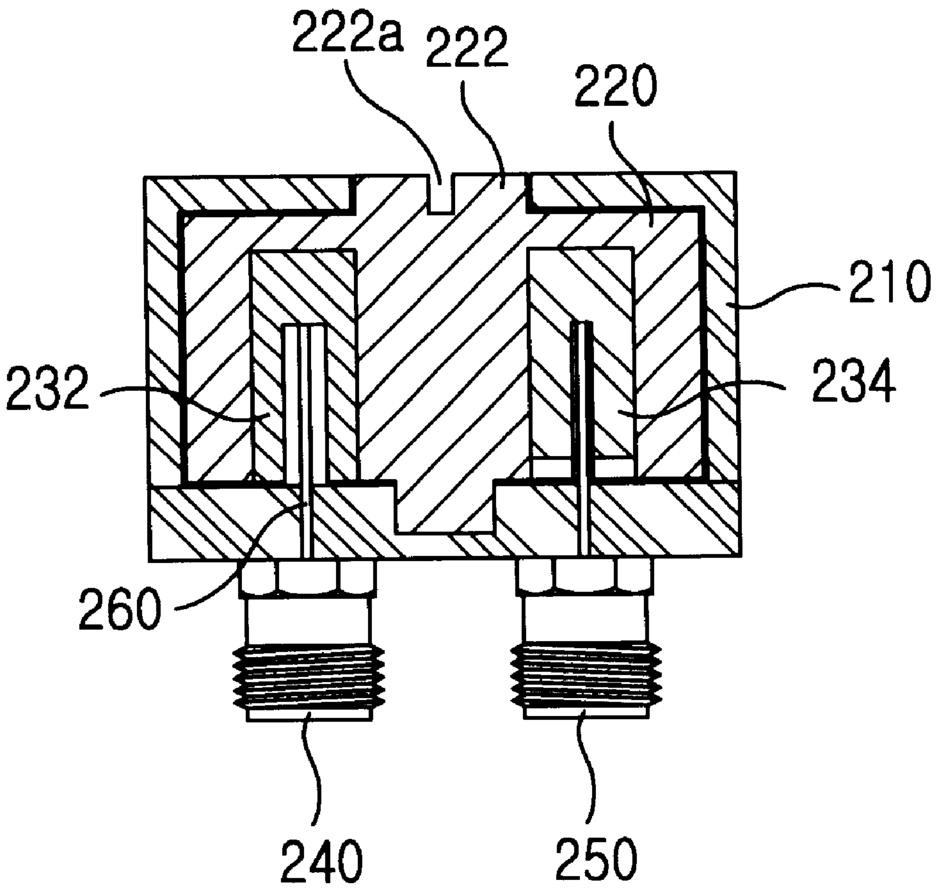
FIG. 9 is a cross-section view of the FIG. 8.

Referring to FIGS. 8 and 9, there is shown a second embodiment of the signal-processing apparatus in accordance with the present invention.

Referring to FIGS. 8 and 9, the signal-processing apparatus of the second embodiment comprises an outer conductor 220 coupled in a housing 210. The conductor 220 includes a protrusion 222 having a recess 222*a* for fitting a driving shaft of motor on upper portion thereof and an annular opening for fixing first and second members 232 and 234 in lower portion thereof. In this case, the first and second members 232 and 234 respectively have a first and second grooves 232*a* and 234*a* in which an inner conductor 260 is positioned. The first groove 232*a* is communicated with the second groove 234*a*. Size of the first groove 232*a* is larger than that of the second groove 234*a*. Transversal cross-section of the inner conductor 260 substantially has a semicircular arch-shape. The inner conductor 260 has a pair of terminals formed in lower ends thereof and passing the housing 210. The terminals are respectively connected to an input and output connectors 240 and 250 coupled to lower portion of the housing 210. Therefore, the inner conductor 260 always retains its origin position. The input and output connectors 240 and 250 are parallel with the protrusion 222.

In the second embodiment constructed as the above-mentioned, if the first and second members 232 and 234 are made of a first and second dielectric material respectively having dielectric constants different from each other, the signal-processing apparatus functions as a phase shifter. Further, if the first and second members 232 and 234 are respectively made of a first and second absorbers capable of absorbing a radio wave, i.e., ferrite, the signal-processing apparatus of the first embodiment functions as an attenuator. Since operation of the signal-processing apparatus in the second embodiment is similar to that of the first embodiment, the operation description of the second embodiment will be omitted.

Figure 10:
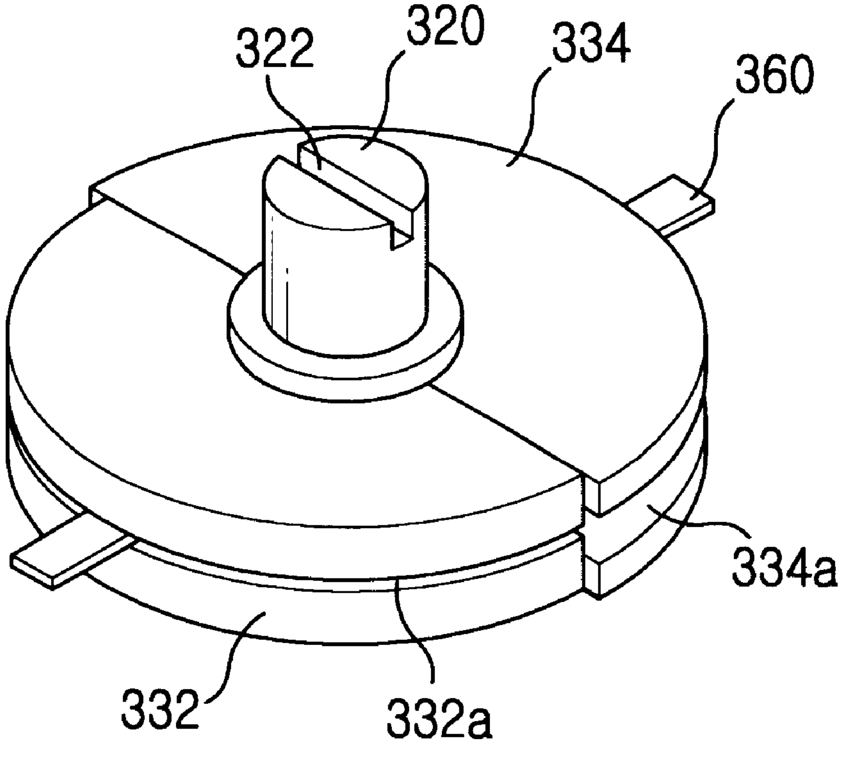
FIG. 10 is a perspective view schematically representing a third embodiment of a signal-processing apparatus for shifting phase of a signal inputted thereto and attenuating the signal in accordance with a present invention.
Figure 11:
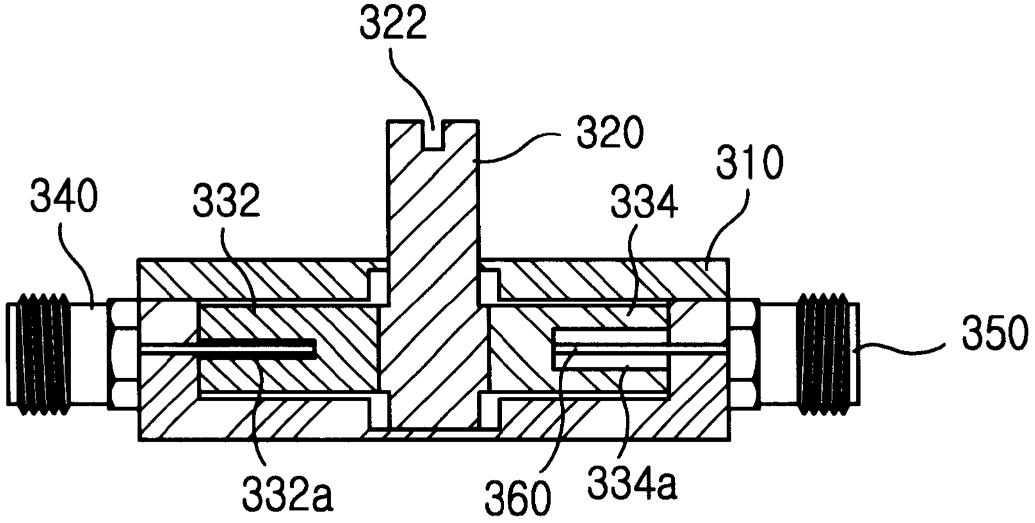
FIG. 11 is a cross-section view of the FIG. 10.

Referring to FIGS. 10 and 11, there is shown a third embodiment of the signal-processing apparatus in accordance with the present invention.

As shown in FIGS. 10 and 11, the signal-processing apparatus of the third embodiment comprises a housing 310, a shaft 320 having upper portion protruded from the housing 310, first and second members 332 and 334 fixed to peripheral portion of the shaft 320, an input and output connectors 340 and 350 respectively coupled to both sides of the housing 310, and an inner conductor 360 located within the first and second members 332 and 334. The shaft 320 has a recess 322 formed on the upper portion to fit a driving shaft of motor. Each of the first and second members 332 and 334 takes the shape of semicircle and has first and second grooves 332*a* and 334*a* respectively formed on the peripheral portion thereof. The inner conductor 360 takes the shape of semicircular arch substantially.

In this embodiment, the first and second members 332 and 334 are fixed to the shaft 322 so that the first groove 332*a* is communicated with the second groove 334*a*.

In the third embodiment constructed as the above-mentioned, if the first and second members 332 and 334 are made of a first and second dielectric material respectively having dielectric constants different from each other, the signal-processing apparatus functions as a phase shifter. Further, if the first and second members 332 and 334 are respectively made of a first and second absorbers capable of absorbing a radio wave, i.e., ferrite, the signal-processing apparatus of the third embodiment functions as an attenuator. Since operation of the signal-processing apparatus in the third embodiment is similar to that of the first embodiment, the operation description of the third embodiment will be omitted.

Figure 12:
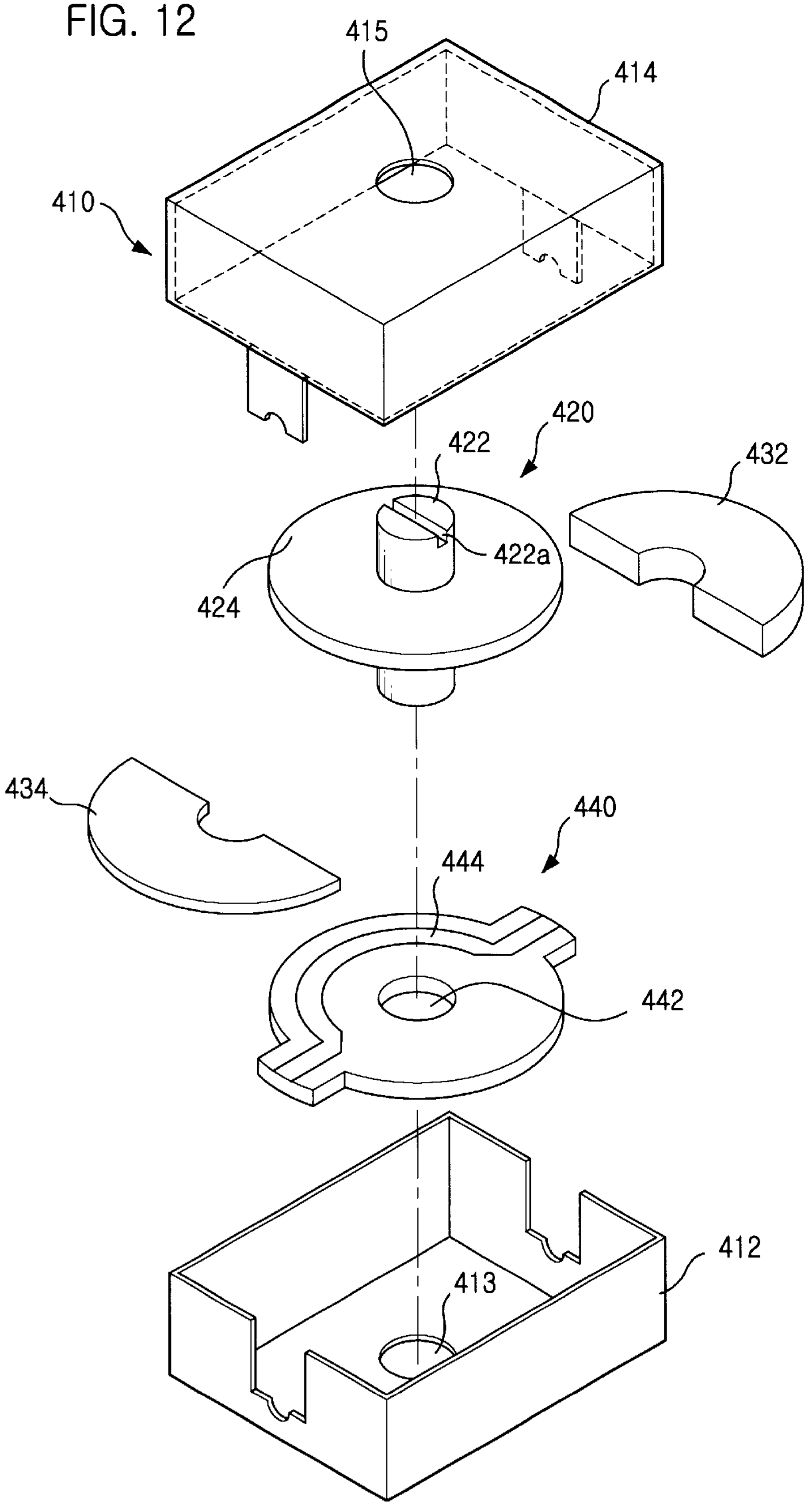
FIG. 12 is a disassembled perspective view representing a fourth embodiment of a signal-processing apparatus for shifting phase of a signal inputted thereto and attenuating the signal in accordance with a present invention.
Figure 13:
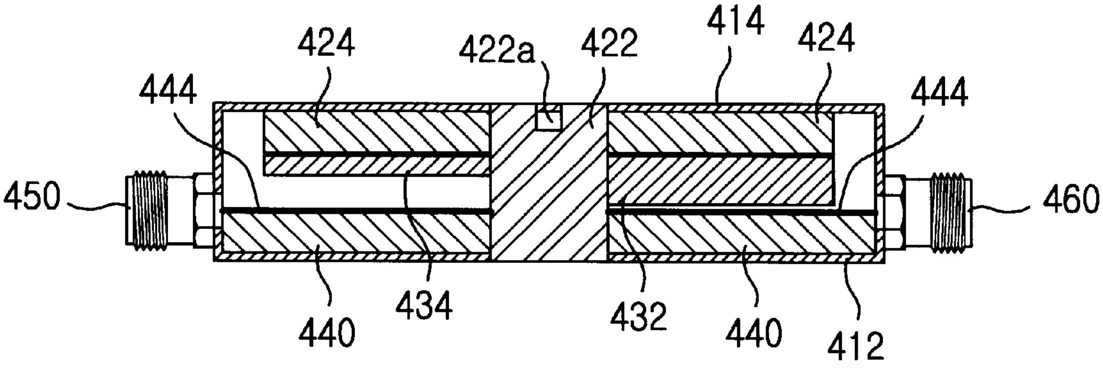
FIG. 13 is a cross-section view showing assembled state of the fourth embodiment in accordance with a present invention.

Referring to FIGS. 12 and 13, there is shown a fourth embodiment of the signal-processing apparatus in accordance with the present invention.

As shown in FIGS. 12 and 13, the signal-processing apparatus of the fourth embodiment comprises a housing 410 and an outer conductor 420 coupled in the housing 410. The housing 410 includes a box 412 having an opening at its upper portion and a cover 414 for closing the opening of the box 412. The box 412 has a pair of cut portions formed on both upper portions thereof and a concave portion 413 formed on bottom surface thereof. The cover 414 has a pair of protrusions respectively inserted into the cut portions and a through hole 415 formed on a portion opposite to the concave portion 413. When the cover 414 closes the opening of the box 412, predetermined spaces are respectively formed between each of the cut portions of the box 412 and each of the protrusions of the cover 414.

The outer conductor 420 includes a shaft 422 to be connected to a motor(not shown) and a disk 424 coupled to peripheral portion of the shaft 422. Further, the shaft 422 has a recess 422*a* for fitting a driving shaft of the motor on top surface thereof. In this case, upper and lower portions of the shaft 422 are respectively supported at the concave portion 413 of the box 412 and the through hole 415 of the cover 414. The disk 424 is integrally formed with the shaft 422 or has a through hole at center portion thereof to fix the shaft 422.

The signal-processing apparatus of this embodiment also has first and second members 432 and 434 respectively coupled to peripheral portion of the shaft 422 and a printed circuit board (hereinafter, referred to PCB) 440 having a through hole 442 for passing the shaft 422 at center portion thereof. The first and second members 432 and 434 take the shape of substantial semicircle and respectively have thickness different from each other. The PCB 440 has a substantial semicircular arch-shaped transmission line 444 coated with a conductive materials. The rest portion of the PCB 440 except the transmission line 444 is preferably made of non-conductive materials. Both ends of the transmission line 444 are respectively protruded from spaces formed between each of the cut portions of the box 412 and each of the protrusions of the cover 414. In this case, the both ends of the transmission line 444 are respectively connected to input and output connectors 450 and 460 coupled to both sides of the housing 410.

In the fourth embodiment constructed as the above-mentioned, if the first and second members 432 and 434 are made of a first and second dielectric material respectively having dielectric constants different from each other, the signal-processing apparatus of the fourth embodiment functions as a phase shifter. Further, if the first and second members 432 and 434 are respectively made of a first and second absorbers capable of absorbing a radio wave, i.e., ferrite, the signal-processing apparatus of the fourth embodiment functions as an attenuator. Since operation of the signal-processing apparatus in the fourth embodiment is similar to that of the first embodiment, the operation description of the fourth embodiment will be omitted.

Figure 14:
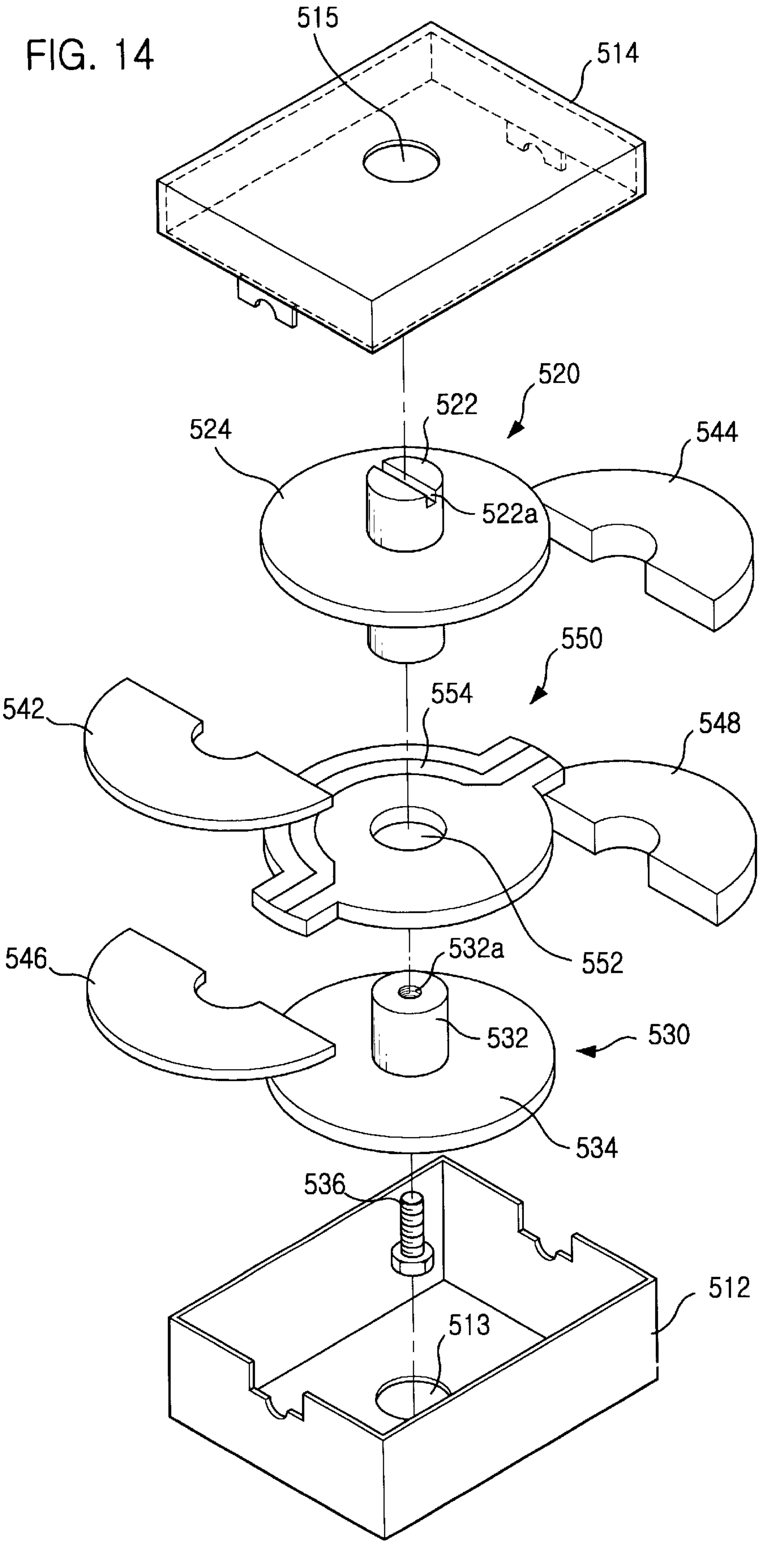
FIG. 14 is a disassembled perspective view representing a fifth embodiment of a signal-processing apparatus for shifting phase of a signal inputted thereto and attenuating the signal in accordance with a present invention.
Figure 15:
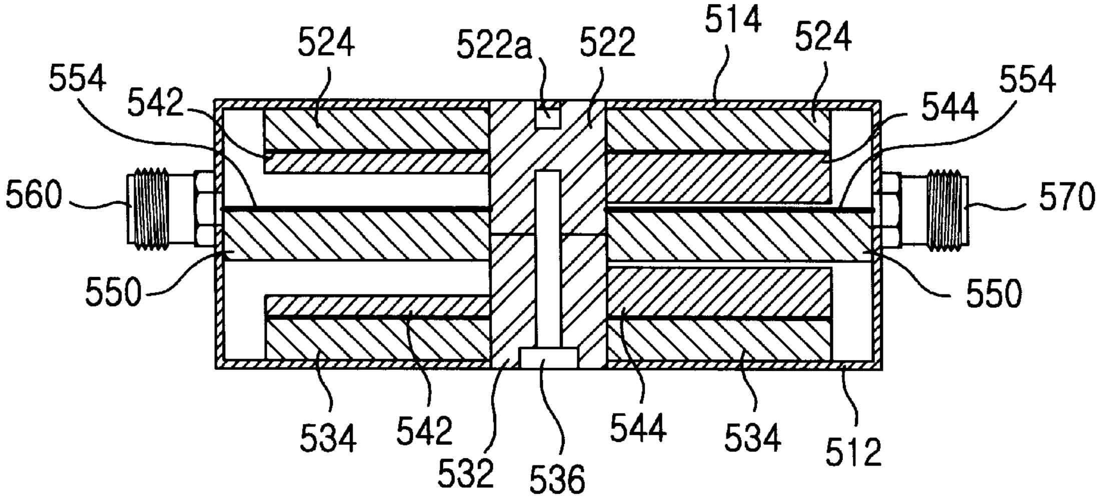
FIG. 15 is a cross-section view showing assembled state of the fifth embodiment in accordance with a present invention.

Referring to FIGS. 14 and 15, there is shown a fifth embodiment of the signal-processing apparatus in accordance with the present invention.

As shown in FIGS. 14 and 15, the signal-processing apparatus of the fifth embodiment comprises a housing 510 including a box 512 and cover 514 respectively similar to box and cover in the fourth embodiment and first and second outer conductors 520 and 530 coupled in the housing 510.

The first outer conductor 520 has a first shaft 522 connected to a motor (not shown) and a first disk 524 coupled to peripheral portion of the first shaft 522. The second conductor 530 has a second shaft 532 to be joined to the first shaft 522 and a second disk 534 coupled to peripheral portion of the second shaft 532. Preferably, each of the first and second conductors 520 and 530 is integrally formed. In this case, the first shaft 522 includes a recess 522*a* for fitting a driving shaft of the motor on upper portion thereof and a first longitudinal hole for joining a screw 536 on lower portion thereof. Lower portion of the second shaft 532 is rotatably coupled to a concave portion 513 of the box 512 and has a second longitudinal hole 532*a* for joining the screw 536.

The first and second shafts 522 and 532 are coupled by the screw 536 joined to the first longitudinal hole through the second longitudinal hole 532*a*. In this case, for preventing a head of the screw 536 from contacting with the housing 510, the lower portion of the second longitudinal hole 532*a* is preferably formed to accommodate the head of the screw 536.

The signal-processing apparatus of the fifth embodiment has first and second members 542 and 544 coupled to peripheral portion of the first shaft 522 and a third and fourth members 546 and 548 coupled to peripheral portion of the second shaft 532. The first to fourth members 542 to 548 have a semicircle-shaped section. The first and second members 542 and 544 are spaced out a predetermined distance from the third and fourth members 546 and 548. In this case, the signal-processing apparatus of the fifth embodiment also has a printed circuit board (hereinafter, referred to PCB) 550 coupled in space between the members coupled to the first shaft 522 and the members coupled to the second shaft 532. The PCB 550 has a through hole 552 for passing the shaft. The first and third members 542 and 546 respectively have thickness different from the second and fourth members 544 and 548. Therefore, the space between the firth and third members 542 and 546 is larger than that between the second and fourth members 544 and 548.

The PCB 550 has a transmission line 554 coated with conductive materials thereon and the rest of the PCB 550 except the transmission line 554 is coated with non-conductive materials. The transmission line 554 is formed in substantial semicircular arch-shape and its both ends are respectively protruded from both sides of the housing 510. The both ends of the transmission line 554 are respectively connected to input and output connectors 560 and 570.

In the fifth embodiment constructed as the above-mentioned, if the first to fourth members 542 to 548 are made of dielectric material respectively having dielectric constants different from one another, the signal-processing apparatus functions as a phase shifter. Further, if the first to fourth members 542 to 548 are respectively made of absorbers capable of absorbing a radio wave, i.e., ferrite, the signal-processing apparatus of the fifth embodiment functions as an attenuator. Since operation of the signal-processing apparatus in the fifth embodiment is similar to that of the first embodiment, the operation description of the fifth embodiment will be omitted.

In accordance with the present invention, the signal-processing apparatus can miniaturize and be stably operated without regard to outside circumstance because an electric device is not installed.

Further, since signal-processing apparatus of the present invention uses a printed circuit board as a transmission line for an inputted signal, the manufacturing process is simple and, therefore, production efficiency of the signal-processing apparatus is improved and cost is reduced.

While the present invention has been described with respect to certain preferred embodiments only, other modifications and variation may be made without departing from the spirit and scope of the present invention as set forth in the following claims.

What is claimed is:

1. A signal-processing apparatus for shifting phase of a signal inputted thereto and attenuating the signal, comprising:

an input connector for inputting a signal;

an output connector for outputting the signal;

a rotation body to be rotated by a rotational force;

a plurality of rotatable members respectively having a groove in peripheral portion, the rotatable members being coupled to peripheral portion of the rotation body so that the grooves communicate with each other; and a signal transmitting member for transmitting the inputted signal to the output connector, the signal transmitting member being located in the grooves and its both ends being respectively connected to the input and output connectors.

2. The signal-processing apparatus as recited in claim 1, further comprising a rotational force supplying means for generating the rotational force.

3. The signal-processing apparatus as recited in claim 1, wherein the rotatable members include a first semicircular member having a first groove and a second semicircular member having a second groove communicated with the first groove, wherein the signal transmitting member includes a semi-circular arch-shaped conductor having a curvature substantially equal to the first and second grooves.

4. The signal-processing apparatus as recited in claim 3, wherein height of the first groove is different from that of the second groove.

5. The signal-processing apparatus as recited in claim 4, wherein the rotation body includes a shaft connected to the rotational force supplying means.

6. The signal-processing apparatus as recited in claim 5, wherein the rotation body further includes first and second disks coupled to peripheral portion of the shaft to move together with the shaft, and wherein the first and second disks are spaced out a predetermined distance from each other to form a space for locating the rotatable members.

7. The signal-processing apparatus as recited in claim 6, wherein the first and second disks are integrally formed with the shaft.

8. The signal-processing apparatus as recited in claim 7, wherein the rotatable members are respectively made of dielectric material.

9. The signal-processing apparatus as recited in claim 7, wherein the rotatable members are respectively made of absorbers capable of absorbing a radio wave.

10. A signal-processing apparatus for shifting phase of a signal inputted thereto and attenuating the signal, comprising;

an input connector for inputting a signal;

an output connector for outputting the signal;

a rotation body to be rotated by a rotational force, the rotation body having an annular opening at lower portion thereof and being made of conductor;

a plurality of rotatable members respectively having a groove in lower portion, the rotatable members being coupled to peripheral portion of the rotation body so that the grooves communicate with each other; and a signal transmitting member having terminals respectively connected to the input and output connectors so that the signal inputted to the input connector is transmitted to the output connector, the signal transmitting member being located in the groove.

11. The signal-processing apparatus as recited in claim 10, further comprising a rotational force supplying means for generating the rotational force.

12. The signal-processing apparatus as recited in claim 10, wherein the rotatable members are respectively made of dielectric material.

13. The signal-processing apparatus as recited in claim 10, wherein the rotatable members are respectively made of absorbers capable of absorbing a radio wave.

14. A signal-processing apparatus for shifting phase of a signal inputted thereto and attenuating the signal, comprising;

an input connector for inputting a signal;

an output connector for outputting the signal;

a rotational force supplying means for generating the rotational force;

a first rotation body to be rotated by the rotational force, the first rotation body having a first shaft connected to the rotational force supplying means and a first disk coupled to peripheral portion of the first shaft to be moved together with the first shaft;

a first member coupled to peripheral portion of the first shaft to be moved together with the first shaft;

a second member coupled to peripheral portion of the first shaft, against to the first member, to be moved together with the first shaft; and a signal transmitting member for transmitting the signal inputted through the input connector to the output connector, the signal transmitting member being located under the first and second members and its both ends being respectively connected to the input and output connectors.

15. The signal-processing apparatus as recited in claim 14, wherein the signal transmitting member includes a printed circuit board having a transmission line, coated with conductive material, of which both ends are respectively connected to the input and output connectors.

16. The signal-processing apparatus as recited in claim 15, wherein thickness of the first member is thicker than that of the second member.

17. The signal-processing apparatus as recited in claim 16, wherein each of the first and second members takes the shape of semicircle, and wherein the transmission line takes the shape of semicircular arch having a curvature substantially equal to the first and second members.

18. The signal-processing apparatus as recited in claim 14, wherein the first and second members are respectively made of dielectric material.

19. The signal-processing apparatus as recited in claim 18, wherein the first and second members are respectively made of absorber capable of absorbing a radio wave.

20. The signal-processing apparatus as recited in claim 17, further comprising:

a second rotation body including a second shaft joined to the first shaft to be moved together with the first shaft and a second disk coupled to peripheral portion of the second shaft to be moved together with the second shaft;

a third member coupled to peripheral portion of the second shaft to be moved together with the second shaft; and a fourth member coupled to peripheral portion of the second shaft, against to the third member, to be moved together with the second shaft, and wherein the signal transmission member is located within a space between the first and second members coupled to the first shaft and third and fourth members coupled to the second shaft.

21. The signal-processing apparatus as recited in claim 20, wherein distance between the first member and the third member facing to the first member is different from that between the second member and the fourth member facing to the second member.

* * * * *